United States Patent
Camargo et al.

(10) Patent No.: US 10,607,043 B2
(45) Date of Patent: Mar. 31, 2020

(54) SUBSURFACE RESERVOIR MODEL WITH 3D NATURAL FRACTURES PREDICTION

(71) Applicant: Saudi Arabian Oil Company, Dhahran (SA)

(72) Inventors: Otto E. Meza Camargo, Dhahran (SA); Tariq Mahmood, Dhahran (SA); Khalid Hawas, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 242 days.

(21) Appl. No.: 15/704,236

(22) Filed: Sep. 14, 2017

(65) Prior Publication Data

US 2019/0080122 A1    Mar. 14, 2019

(51) Int. Cl.
| | |
|---|---|
| G06G 7/48 | (2006.01) |
| G01V 11/00 | (2006.01) |
| G06G 7/57 | (2006.01) |
| E21B 43/26 | (2006.01) |
| G01V 99/00 | (2009.01) |
| G06F 30/20 | (2020.01) |
| G01V 9/00 | (2006.01) |
| E21B 49/00 | (2006.01) |

(52) U.S. Cl.
CPC ........... *G06G 7/48* (2013.01); *E21B 43/26* (2013.01); *G01V 11/00* (2013.01); *G01V 99/005* (2013.01); *G06F 30/20* (2020.01); *G06G 7/57* (2013.01); *E21B 49/00* (2013.01); *G01V 9/00* (2013.01)

(58) Field of Classification Search
CPC ...................................................... G06G 7/48
USPC ........................................................ 703/10
See application file for complete search history.

(56) References Cited

U.S. PATENT DOCUMENTS

| | | | |
|---|---|---|---|
| 7,562,278 | B2 | 7/2009 | Lyakh et al. |
| 8,204,727 | B2 | 6/2012 | Dean et al. |
| 8,301,427 | B2 | 10/2012 | Souche et al. |
| 8,374,836 | B2 | 2/2013 | Yogeswaren |
| 9,305,121 | B2 | 4/2016 | Yao et al. |
| 9,390,204 | B2 | 7/2016 | Bowen et al. |
| 9,417,348 | B2 | 8/2016 | Lin |
| 2007/0272407 | A1 | 11/2007 | Lehnman et al. |
| 2014/0358510 | A1 | 12/2014 | Sarkar et al. |
| 2015/0276979 | A1 | 10/2015 | Hugot et al. |
| 2016/0266278 | A1 | 9/2016 | Holderby et al. |
| 2017/0051598 | A1 | 2/2017 | Ouenes |

(Continued)

OTHER PUBLICATIONS

Al-Hawas, K. et al, Delineation of fracture anisotropy signatures in Wudayhi Field by azimuthal seismic data; The Leading Edge, Interpreter's Corner, Dec. 2003; pp. 1202-1211.

(Continued)

*Primary Examiner* — Hugh M Jones
(74) *Attorney, Agent, or Firm* — Bracewell LLP; Constance G. Rhebergen; Albert B. Kimball, Jr.

(57) ABSTRACT

In reservoir hydrocarbon exploration, fracture characteristics of subsurface reservoir formations are analyzed based on measures obtained about the subsurface formations and rock. Models of subsurface reservoirs are developed with predictions of natural fracture networks within the subject subsurface reservoirs. The mechanical properties of the formation rock in the reservoirs serve as a main controller to model the natural fractures distribution and their properties. The models so formed are important in the location and completion of wells for hydrocarbon exploration and production.

14 Claims, 5 Drawing Sheets

(56) References Cited

U.S. PATENT DOCUMENTS

2017/0132339 A1    5/2017  Umholtz et al.
2017/0176228 A1    6/2017  Elisabeth

OTHER PUBLICATIONS

Gray, D. et al, "Fracture Detection in the Manderson Field: A 3D AVAZ", Case History: The Leading Edge, vol. 19, No. 11, 1214-1221.

Herwanger, J. et al.; Seismic Geomechanics—How to Build and Calibrate Geomchecanical Models Using 3D and 4D Seimic Data:, 1 Edn., EAGE Publications b.v. Houten, 2011; Chapters 2, pp. 19-39; Chapter 6 pp. 102-118.

Rogers S. et al, "Integrating discrete fracture network models and pressure transient data for testing conceptual fracture models of the Valhall chalk reservoir, Norway North Sea"; Geological Society, London, S. 2007, pp. 187-197.

Zellou, A. et al.; "Fractured Reservoir Characterization Using Post-Stack Seismic Attributes—Application to a Hungarian Reservoir", Proc. 68th EAGE Conference and Exhibition, 2006, 4 pp.

International Search Report and Written Opinion for related PCT application PCT/US2018/046824 dated Nov. 28, 2018, 13 pp.

SUBSURFACE RESERVOIR MODEL WITH 3D NATURAL FRACTURES PREDICTION

BACKGROUND OF THE INVENTION

1. Field of the Invention

The present invention relates to developing or forming models of subsurface reservoirs and prediction of natural fracture networks within the subsurface reservoirs.

2. Description of the Related Art

Natural fractures present in subsurface formations are discontinuities representing a surface or zone of mechanical failure in the formation. Natural fractures have been formed over geological time as a result of movements and deformations within the subsurface rock over time. Natural fractures continue to be formed as a result of microseismic events which are slight tremors or movements in the earth's crust arising from various natural sources. Natural fractures are thus different in origin and nature form fractures induced in earth formations from the practice of hydraulic fracturing or fracking.

Natural fracture prediction is one of the more challenging problems in reservoir characterization. Fracture distributions are related to various factors such as intrinsic rock mechanics properties, as well as movements and deformation of the formation rock layers due to different tectonic stages to which the lithological formations are subjected through geological time. However, those parameters are usually unknown for the purposes of hydrocarbon exploration and development. Thus, the presence of natural fractures must be modeled to understand the most probable or likely fracture distribution.

In highly complex geological environments due to different tectonics, understanding the natural fracture distributions and their properties can be important for conducting hydrocarbon exploration and development programs. A natural fracture can define a geological trap indicating possible leakage in the reservoir. Natural fractures reduce the risk for drilling operations and have an impact on reservoir management. For example, natural fractures affect formation permeability. Natural fractures can improve the recovery factor for a hydrocarbon reservoir, and also may make it possible to connect different fluid zones. For hydrocarbon exploration and development programs, natural fractures can define possible fluid leakage by which fluid possibly migrates to different formations. Natural fractures can also have an influence on the fluid contacts levels in the formations.

Drilling operational programs can also be impacted by the presence of natural fractures crossing a wellbore. Due to complex distributions of natural fractures in a reservoir, the fractures possibly affect drilling operations, for example presenting possible drilling troubles, mud loss circulation, stuck pipes, and the like.

According to the hydrocarbon storage in a reservoir, the hydrocarbons can be stored in the primary porous medium of the formation rock, as well as secondary porous media formed by natural fractures and other types such as vugs, caverns, and the like. Natural fractures as secondary storage mechanisms for hydrocarbon play a very important role in some tight reservoir fields, enhancing the capacity to produce from such reservoir. Natural fractures enhance the formation rock permeability, and the fluid capacity of fractures, causing anisotropic permeability. Natural fractures enhance the permeability and connectivity between the primary porous media of the formation rock, supporting the flow of hydrocarbons into the wellbore. Natural fractures can also connect the porous and non-porous media of different rock layers of a reservoir in lower permeability conditions or situations.

Several techniques to build a natural fracture model have been described in the past, using different approaches. Examples include using seismic attributes from seismic exploration surveys for detection and distribution of natural fractures. Examples of this methodology are described in A. M. Zellou, T. Royer, G. C. Robinson, P. Zahuczki, A. Kirali, "Fractured Reservoir Characterization Using Post-Stack Seismic Attributes-Application to a Hungarian Reservoir", Proc. 68th EAGE Conference and Exhibition, 2006; where Post stack seismic attributes were used as a basis for natural fracture prediction.

Other approaches for natural fracture prediction included fracture characterization based on measurements detected along the wellbore through borehole imaging (resistivity or sonic), based on rock properties (porosity, density, etc.) and fracture characterization along the wells. For area of a reservoir distant form wellbores, this approach was often of limited applicability, since the detection capabilities of well logging tools are limited to regions in the immediate vicinity of the wellbore.

Another approach was to design a reservoir fracture network in a deterministic way into a 3D geological model using conceptual models and validating the results with engineering data. An example of this approach can be found in Rogers. S., Enachescu C., Trice R., and Buer K., 2007, "Integrating discrete fracture network models and pressure transient data for testing conceptual fracture models of the Valhall chalk reservoir", Norway North Sea; Geological Society, London, Special Publication 2007, v. 270; p. 193-204. Other examples are in U.S. Pat. No. 7,565,278 (Li et al.); U.S. Pat. No. 9,390,204 (Bowen et al.); and U. S. Published Patent Application No. 2015/0276979 (Paradigm Sciences).

So far as is known, this methodology relied on assumptions taking the fracture description from the wells and extrapolating those fracture descriptions into a grid model following a conceptual model. Such an approach was based on the reservoir being assumed to one capable of representation as a simplistic model, and was further based on other assumptions which were in some cases less than reliable.

SUMMARY OF THE INVENTION

Briefly, the present invention provides a new and improved method of drilling a well in a subsurface geological structure to a location in a subsurface hydrocarbon reservoir indicated by a natural fracture network model of the reservoir. Reservoir parameters are obtained representing properties of the subsurface reservoir for processing in a data processing system. A natural fracture network model is then formed by processing the obtained reservoir parameters in the data processing system to identify the presence and extent of natural fractures at locations in the subsurface hydrocarbon reservoir. The well is then drilled in the subsurface geological structure to a location in the subsurface hydrocarbon reservoir based on the identified presence and extent of natural fractures in the subsurface geological structure.

DETAILED DESCRIPTION OF THE PREFERRED EMBODIMENTS

Figure 1:
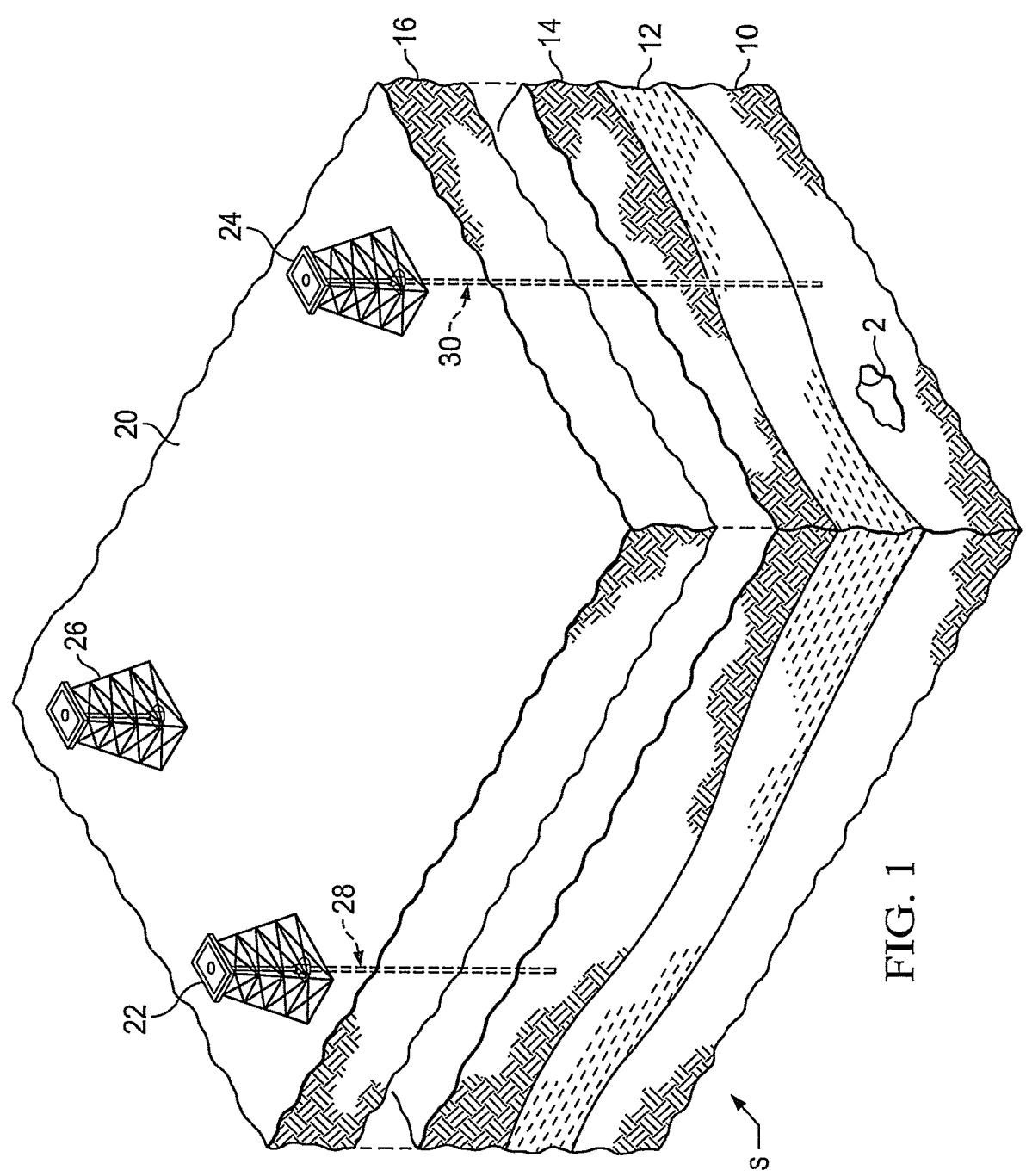
FIG. 1 is a schematic diagram of three dimensional subsurface formations in the earth at a location of interest where wells and a subsurface reservoir are present.

In the drawings, FIG. 1 is an isometric view in schematic form of subsurface geological structure S or formations in the earth at a location where a subsurface hydrocarbon reservoir R in the form of a hydrocarbon producing formation rock layer 10 is present. As shown in FIG. 1, the hydrocarbon producing formation rock layer 10 is present beneath several other formation rock layers, such as indicates at 12, 14 and 16 below the earth surface 20. As indicated at 22, 24 and 26, exploratory or production wells have been drilled to penetrate the earth formations through wellbores as indicated at 28 and 30.

Figure 2:
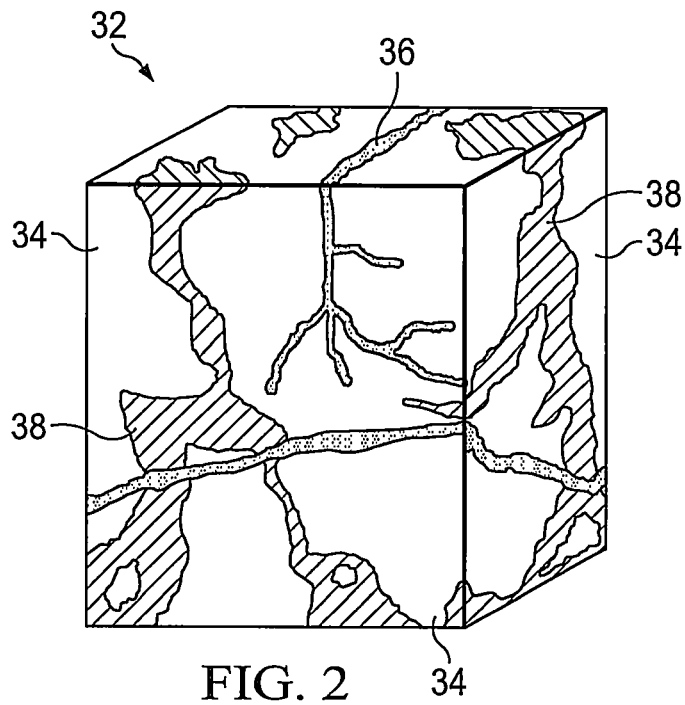
FIG. 2 is a much enlarged view of a portion of a subsurface formation of FIG. 1 showing natural fracture networks in the rock of the formation.

FIG. 2 is a much enlarged view showing a schematic three-dimensional very small segment or portion 32 of the subsurface hydrocarbon producing formation rock layer 10 of FIG. 1. The segment 32 is formed as indicated at 34 of the primary porous medium of the formation rock. An irregular system of microscopic fractures 36 and small cavities or vugs 38 are typically present in the primary porous rock medium 34. Natural fractures in reservoirs can also be present across a wide range of scale, ranging from those shown in FIG. 2 in the form of microfractures to extensive fractures or faults of thousands of meters. The vertical extent of natural fractures is often controlled by thin layers in the form of shale beds or laminations, or by weak layers of rock in carbonate sequences in the earth.

Natural fractures are abundant structural features in the earth. As described above, natural fractures may be caused by a variety of factors including stress in the formation from tectonic forces, which cause folds and the like. It is typical that a hydrocarbon producing reservoir contains some natural fractures, but as described the location and extent of such natural fractures is not directly determinable. Natural fractured reservoirs are difficult systems to characterize and difficult to engineer and predict. Natural fractured reservoirs are an important element in reservoir performance, and it is also important to recognize the performance characteristics of a naturally fractured reservoir.

Natural fractures can significantly affect hydrocarbon migration and trap location in the subsurface formations, as well as flow of hydrocarbons to wellbores during production. Knowledge of the presence and extent of natural fractures can significantly improve reservoir development and reduce hydrocarbon production risks.

The objective of the prior methods to produce a natural fracture model, are based on rock properties (Porosity, density, etc.) and fracture characterization a long of the wells using in some case the post stack seismic attribute as a drive for natural fracture prediction. The prior methodologies have been are based on assumption taking the fracture description from the wells and extrapolate those into the grid model following a conceptual model.

The new methodology is based on the rock mechanical properties combining with different data source like seismic, structural restoration and geomechanics in order to predict the natural fractures. In the new methodology we include the rock mechanical property and previous tectonic deformations are included through the geomechanics modeling, to identify the most probably place where the fractures can be developed.

The methodology of the present invention is based on several disciplines from earth science involving the seismic analysis, structural restoration, reservoir characterization and geomechanics. The present invention thus incorporates and utilizes the main components that have direct influence in the creation, distribution and physical properties of the natural fractures. This approach can be applied for conventional (carbonate, sandstone environment) or unconventional reservoir.

Figure 3:
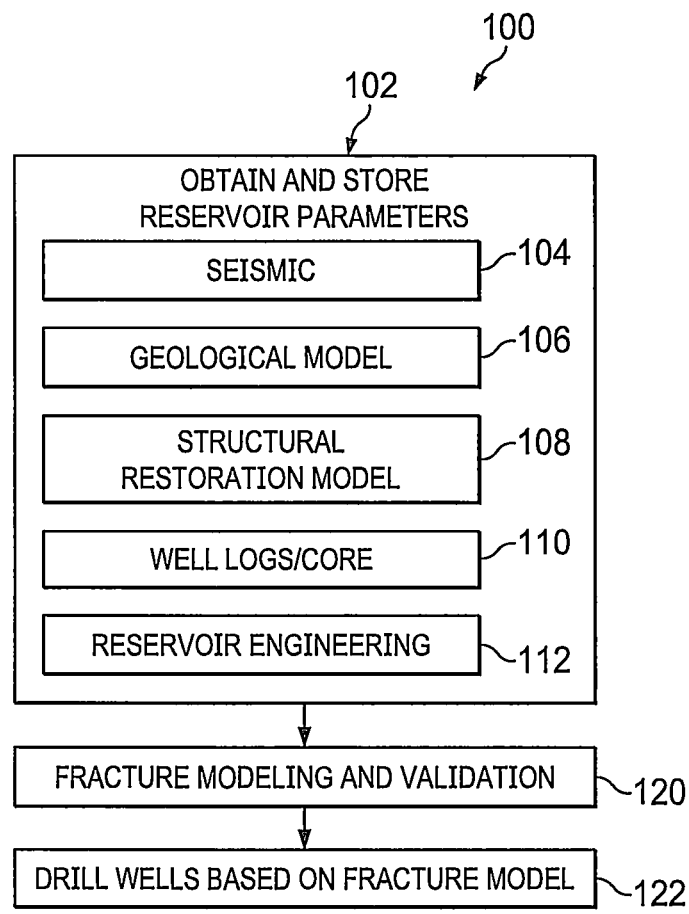
FIG. 3 is a schematic diagram of workflow for reservoir hydrocarbon exploration with natural fracture model prediction according to the present invention.
Figure 7:
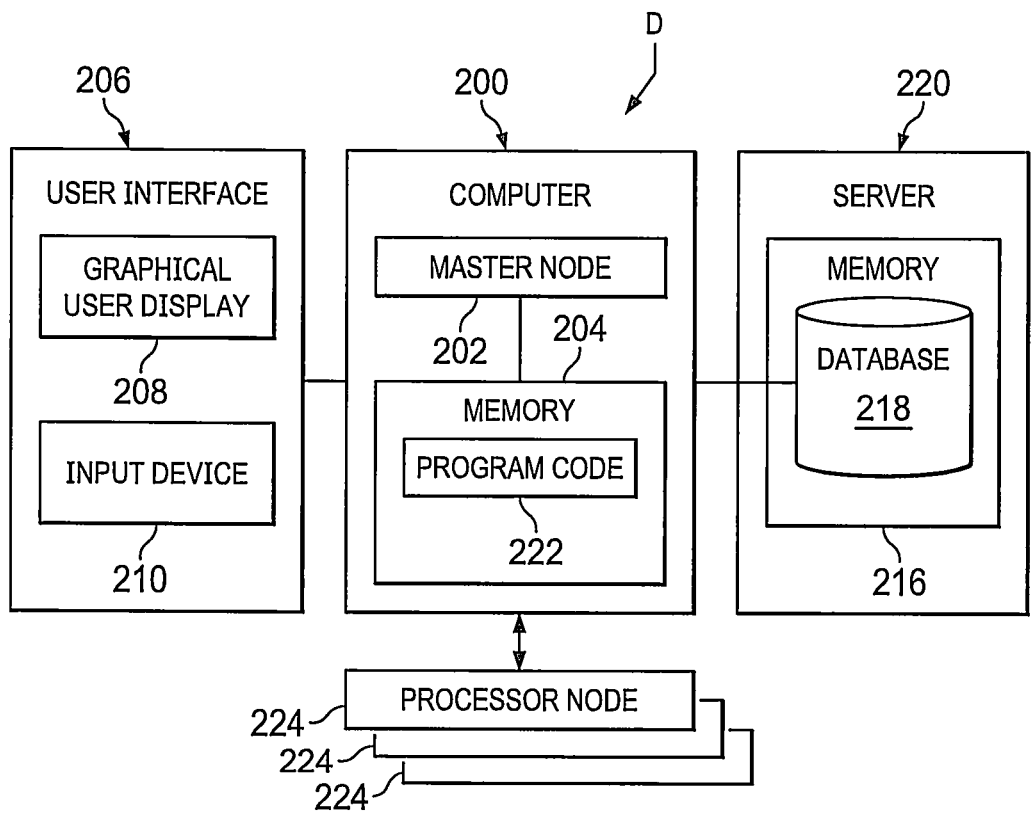
FIG. 7 is a schematic block diagram of a data processing system for reservoir hydrocarbon exploration with natural fracture model prediction according to the present invention.

As shown schematically in FIG. 3, a schematic diagram of the methodology of the present invention for reservoir hydrocarbon exploration, and in particularly the location and completion of wells for hydrocarbon production is illustrated schematically at 100. As indicated at 102 in FIG. 3, reservoir parameters and properties from a plurality of disciplines of earth science are obtained, assembled and stored in a data processing system D (FIG. 7). As shown at 102, the reservoir parameters include seismic attributes from seismic surveys as indicated at 104; rock and mechanical properties from geological modeling as indicated at 106; measures from structural restoration models as indicated at 108; rock geological characterizations as indicated at 110 obtained from formation core samples and well logs performed in the wellbores such as 32 and 34; and reservoir engineering measures obtained as indicated at 112 from production measures and reservoir simulations of the reservoir layer 10.

Figure 4:
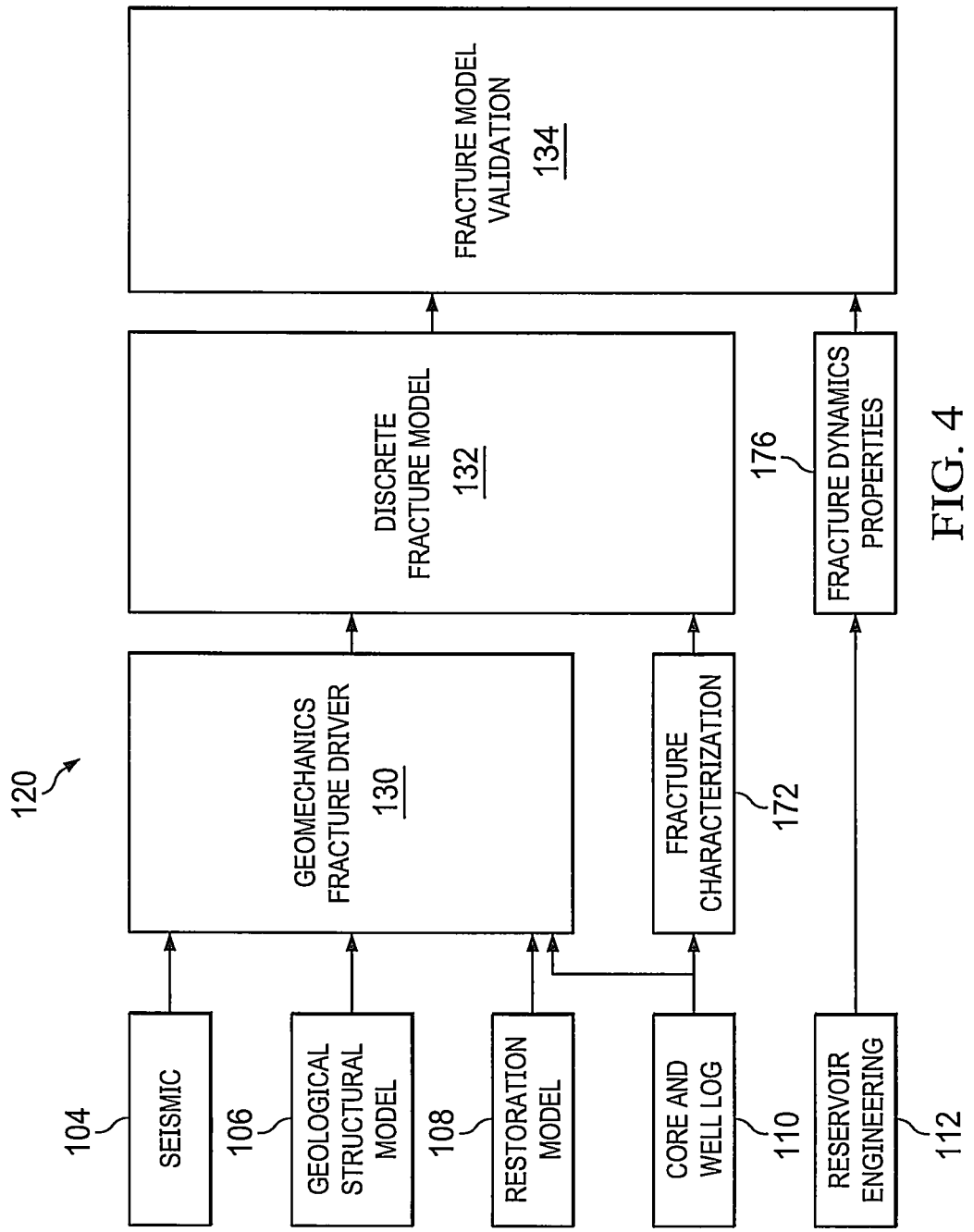
FIG. 4 is a more detailed schematic diagram of workflow according to the present invention for natural fracture model prediction for a subsurface reservoir.
Figure 5:
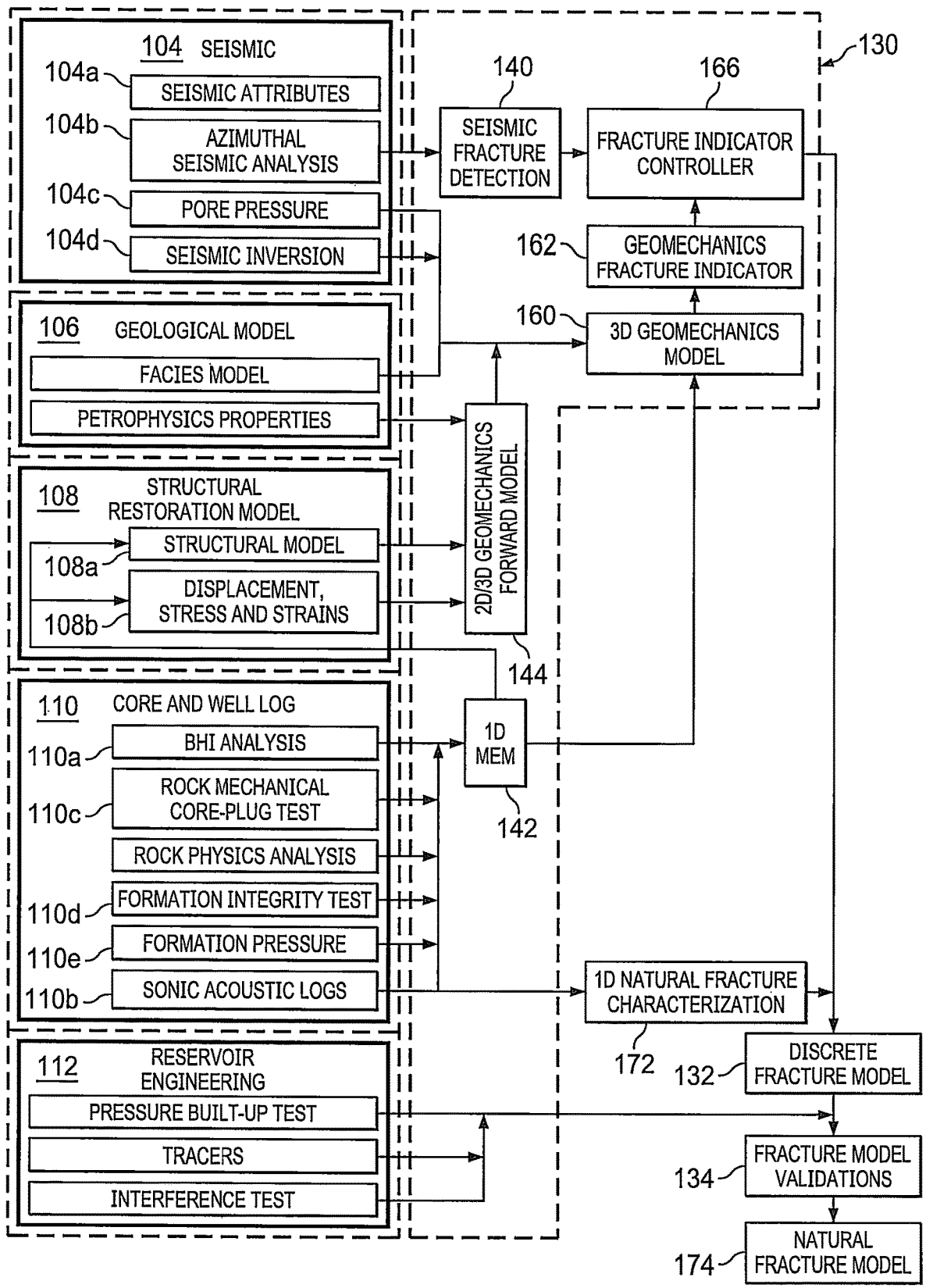
FIG. 5 is a more detailed schematic diagram of the workflow of FIG. 4 according to the present invention for natural fracture model prediction for reservoir hydrocarbon exploration.
Figure 6:
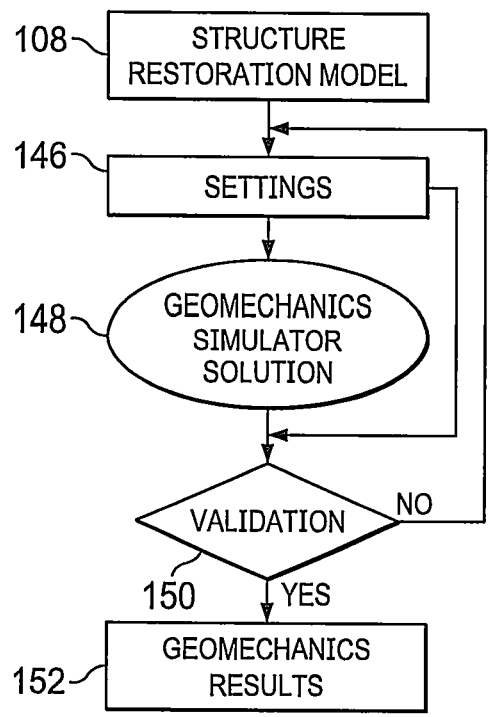
FIG. 6 is a more detailed schematic diagram of the workflow of FIG. 4 according to the present invention for natural fracture model prediction for reservoir hydrocarbon exploration.

As indicated at 120, and as shown in more detail in FIGS. 4, 5 and 6 the assembled reservoir parameters from step 102 are subjected to fracture modeling and to fracture model validation or confirmation. The drilling of additional wellbores of the types already present, as indicated schematically at 32 and 34, is then performed as shown 122. The drilling during step 122 is at locations indicated appropriate by the models resulting from step 120 which are indicated appropriate. Drilling during step 122 is thus directed to regions of the reservoir layer 10 where fractures of the types conducive to increased production are likely to be present. Drilling during step 122 is also enhanced by drilling to avoid earth regions where fractures of types which can cause complications in drilling operations or otherwise adversely affect drilling operations. With the present invention, wells are drilled based on the fracture modeling of natural fracture characteristics of subsurface reservoir formations. The fracture models reflect the influence of several measures of formation parameters obtained from several disciplines.

One of the main components for natural fractures prediction using this methodology is the geomechanical model, wherein an in situ stress regime and the paleo-stress deformation accumulated by different geological time have been included into the workflow. In the context of the present invention, the in situ stress regime is a condition where the stress field is unperturbed or is in equilibrium without any production or influences of perforated wells The natural fracture system is closely related with the current and past deformation due the stress variation through the geological time. Different types of fractures can be created during those episodes.

As shown in FIG. 4, the methodology of the processing 120 is performed in three phases or stages. A first processing stage 130 takes the form of a geomechanics fracture controller, while a second processing stage 132 produces a predicted natural fracture model and a third processing stage 134 validates or confirms the fracture model resulting from step 132.

The geomechanics fracture controller process 130 involves integration between the paleo-stress from structural restoration model 108 obtained for several stages in geological time, and current stress regime conditions obtained through geomechanical numerical simulation model. This step involves seismic volume interpretation techniques and attributes that can be applied to detect possible faults and natural fractures alignments by using post stack discontinuities attributes, azimuthal analysis and elastic seismic inversion.

The natural fracture model prediction processing stage 132 is performed to quantify fracture density in the subsurface reservoir layer 10 using the geomechanics fracture controller results from step 130, and fracture characterization 172 provided from core samples and borehole well log images from a borehole image (BHI) analysis process 110a. Step 132 also determines fracture dimensions and their properties into the discrete fracture model, as will be described. Examples of the fracture properties resulting from step 132 include fracture position, orientation, geometry, porosity, aperture, permeability, and the like. It should be understood that other fracture properties could also be estimated during step 132, if desired.

In the fracture modeling validation or confirmation processing step or stage 134, the fracture model resulting from step 132 is cross-checked or validated using reservoir production data. If necessary, the natural fracture model may need to be upscaled to conform to a fine-scale cell grid of geological model and reproduce the natural fracture distribution and their properties, for comparison with the reservoir production data for validation proposes. Several types of reservoir production data can be used to calibrate the fracture model with reservoir engineering data. Example of such reservoir production data are results of measures obtained from: PTA (Pressure Transient Analysis), tracers, drilling operation events, PLT (production logs), and the like. It should be understood that other reservoir production data can also be used for cross-checking during step 134, if desired.

Considering the natural fracture model prediction processing stage 130 more in detail (FIG. 5), a seismic fracture detection process 140 is provided with seismic attributes 104a obtained from seismic volume results 104. The seismic attributes 104a provided are attributes related to natural fractures detections or dislocation detections. Examples of such attributes obtained from the seismic dislocations attribute analysis results are: variance, anti-tracking, flatness, curvature, and the like. It should be understood that other seismic fracture attributes might also be provided. Seismic fracture attributes cannot be compared straight forward at wellbore scale due to resolutions issues. However, seismic attributes can be used as a seismic fracture controller or conduct for minor fractures detected at wellbore scale, if the relations regarding to the locations and intensity between them exist.

Advance seismic fracture detection may also be performed, if desired, during the seismic fracture detection process 140 using azimuthal seismic analysis 104b as indicated in FIG. 5, in order to capture the variations of the wave propagation at different directions. Such variations in wave propagation form anisotropic volumes in the reservoir layer 10 and are helpful in detecting fractures. This azimuthal analysis requires knowledge regarding whether the anisotropy response in the reservoir 10 is due to natural fractures or caused by another reason. In order to identify whether the anisotropy response maybe azimuthal shear anisotropy, sonic acoustic acquisition can be perform at the well location. An example of azimuthal seismic analysis is described in: Gray, F. D. and Head, K. J., 2000, Fracture Detection in the Manderson Field: A 3D AVAZ Case History: The Leading Edge, Vol. 19, No. 11, 1214-1221; and Khalid Al-Hawas, Mohammed Ameen, Mohammad Wahab, and Ed Nebrija, Saudi Aramco, Dhahran, Saudi Arabia Colin Macbeth, Heriot-Watt University, Edinburgh, U. K., 2003, "Delineation of Fracture Anisotropy Signatures in Wudayhi Field by azimuthal seismic data", the Leading Edge.

A 1D mechanical earth model (MEM) process 142 of geomechanics fracture controller 130 determines the rock mechanical properties and stress regime conditions in the reservoir layer 10. The 1D MEM process starts with computing the elastic rock mechanical properties deriving from well logs 110b and rock mechanical test 110c; and using additional information as reservoir formation pressures 110e and Formation Integrity Test (FIT) 110d, the in situ stress regime can be predicted and mechanical stratigraphy (Geomechanical Facies) computed. Thus, mechanical stratigraphy conforms the rock mechanical response to the geological deformation process and can be used as constraints for natural fractures presence, constraining their development to some particular layer through brittleness concepts, depending also of the deformation magnitude. Additionally, the maximum horizontal stress direction which can be detected by the Borehole Image Analysis (BHI) 110a, and the in situ stress magnitude derived from 1D MEM process are used to predict the stress regime on the 3D MEM process described by the process 160.

A 2D/3D geomechanics forward model process 144 of natural fracture model prediction processing stage 132 combines a structural model 108a and displacement, paleo-stress and strain measures 108b from the structural restoration model 108 with petrophysical properties 106a from geological model 106. The results take the form of structural restoration as horizons displacement and deformation using boundary conditions. The 2D/3D geomechanics forward model process 144 is performed as a Finite Element Method (FEM) using geomechanics numerical simulation software, to estimate the tensor stress regime corresponding to the deformation estimate from structural restoration at the in situ stress conditions.

FIG. 6 illustrates the methodology to carry on the forward modeling, and is described in more detail below. The initial parameter and strain boundary conditions are defined for the numerical simulation and processing is iteratively repeated until an equilibrium stress is obtained according to present to in situ stress conditions in the reservoir. A number of geomechanics simulator methodologies are commercially available, able to estimate stress conditions using the deformation model from the structural restoration model. These results can be used to calculated or predict the possible origin for the natural fractures as stretching zones, compression zones which is an input to classify the different kind of natural fractures and their possible orientations from a qualitative perspective, using the strain tensor derivate from 144. Example geomechanics simulator methodologies include ABAQUS™ from Dassault Systemes; VISAGE™ from Schlumberger; and ELFEN™ from Rockfield, COMSOL™ from AltaSim Technologies.

In the forward modeling of step 144 (FIGS. 4 and 6), input measures from the structural restoration modeling 108 are received and stored as indicated at step 146 as initial settings. The settings from step 146 are then processed in step 148 by geomechanics simulation of the type described above. The geomechanics simulation results of step 148 are then cross-checked or validated as indicated at step 150 against specified stress equilibrium conditions. As also indicated in FIG. 6, if confirmation results are not achieved during the current iteration, the previous settings of the step are adjusted for iteration by simulation step. Such iterations are repeated until specified conditions are reached. At such time, as indicated at 152 the simulation results are provided as the 2D/3D geomechanics forward model indicating conditions of stress, strain and pre-existing faults and fractures in the reservoir layer.

A 3D geomechanics model process 160 of natural fracture model prediction processing stage 132 provides the measures and indications of rock mechanical properties distribution. The results of 3D geomechanics model process 160 include elastic rock properties and rock strength throughout the 3D geological grid. The 3D geomechanics model process 160 can be calculated by boundary conditions to simulate the in situ stress regime. As has been noted, the in situ stress regime is a condition where the stress field is unperturbed or is in equilibrium without any production or influences of perforated wells Typically, determination of the 3D geomechanics model in the step 160 requires elastic seismic inversion 104b in the form of acoustic impedance, bulk density, and also pore pressure 104c covering the 3D geological model area. The seismic inversion parameters can be obtained from elastic seismic inversion as indicated at 104d and seismic velocity analysis for the pore pressure 104c. Determination of the 3D geomechanics model during step 160 is also based on rock mechanical correlations between dynamics and static elastic rock mechanical properties which have been determined as a result of 1D mechanical earth model (MEM) process 142. 3D mechanical stratigraphy can be calculated using the elastic properties created by the step 160, which also can be used to constrain the fracture distribution using brittleness property definition. An examples processing methodology for performing the 3D geomechanics model process 160 is described in: Herwanger, J. and Koutsabeloulis, N. C.: "Seismic Geomechanics—How to Build and Calibrate Geomechanical Models using 3D and 4D Seismic Data", 1 Edn., EAGE Publications b.v., Houten, 181 pp., 2011.

Additionally, geomechanics forward modeling of the type described above and shown in FIG. 6 is used as a loop process between the 2D/3D geomechanics forward model process 144 and 3D geomechanics model process 160. This process captures the displacement and deformation quantified in a structural restoration model 108, calculating in a more accurate way the strain distribution corresponding to the structural evolution faulting and folding related modeled in the step 108.

A geomechanics fracture indicator process 162 of natural fracture model prediction processing stage 132 forms indications of fractures based on selected rock mechanical properties distributed for the 3D geomechanics model resulting from step 160. The mechanical stratigraphy is defined in the step 160 by using the Brittleness concept can be used as a geomechanics fracture indicator to define the fracture position and density or spacing through the layering. A strain or plastic strain model calculated through the step 144 and 160 can be used as indicator of fracture orientation (Dip and azimuth) and possible areal/volumetric density distribution, according with the kind of geological structural environment. Several components of fractures can be considered as geomechanics indicator for fractures, as for example: fractures relate to folding and fractures related to faulting. The quantifications about the strain are only qualitative in terms of real fracture density present in the reservoir.

In a fracture indicator controller process 166 of natural fracture model prediction processing stage 132, attributes determined from seismic fracture detection process 140 and geomechanics fracture indicator process 162 are compared in terms of fracture position, fracture density and orientation in a qualitative way, to evaluate possible coincidence zones, between the models, where natural fractures can be expected to be created. In some cases, the step 140 and 162 can be complementary due to the different vertical and areal resolution in which both of them are calculated.

The discrete fracture network model step 132 (FIGS. 4 and 5) is performed subsequent to identification of natural fracture location in the fracture indicator controller process 166. The discrete fracture network method is a useful technique to build a representative natural fracture model based on stochastic mathematical simulations. This technique required a fracture controller and the intensity, orientation from a 1D natural fracture characterization step 172.

The fracture modeling step 132 receives the results of the 1D natural fracture characterization 172, which is obtained from the borehole image resistivity analysis or acoustic image interpretation 110a of the rock general characterizations 110 and represents the intensity fracture, aperture, fracture classification and fracture orientation along a wellbore, such as those indicated at 28 and 30.

The fracture intensity model resulting from step 132 is calculated using the fracture indicator controller as a result of step 166 and the intensity fracture characterization 172, the step 166 will constrain the orientation and fracture intensity in a qualitative way the fracture intensity model, and including the step 172, the real fracture intensity quantification can be completed, and this output can be used to predict the natural fracture model through the discrete fracture network methodology. For fracture intensity quantification proposes the fracture intensity derived from 166 has to be normalized to be able to compare with the BHI fracture intensity derived from the step 172.

In the fracture model validation step 174, the discrete fracture model resulting from step 172 is validated or confirmed. The validation is performed using reservoir production data. Several types of data as indicated at 176 can be used as fracture dynamic properties to calibrate the fracture model with reservoir engineering measures 112. For example, PTA (Pressure Transient Analysis) test measures, or measures from tracers, drilling operations, production logs, and the like can be used. The natural fracture model may upscale into the fine-scale cell grid geological model, and reproduce the natural fracture distribution and their properties to compare with the validation data.

In natural fracture model validation step 174, several inputs can be useful in order to calibrate and validate the fracture model, for example pressure transient analysis can estimate permeability contribution due to fracture presence and the capacity for fluid flow due to the fractures presence.

Another technique includes the tracer injection, production logs, interference test and possibly some drilling events as mud loss circulation that can evidence the natural fracture presence.

After validation by cross-check during step 134, a final fracture model is produced as indicated at step 174 as a result of the fracture modeling process 120. As previously described, the fracture model so formed indicates the presence and extent of natural fractures in the subsurface geological structures. Based on the indicated present and extent of natural fractures, drilling during step 122 (FIG. 1) to locations in the subsurface reservoir layer 10.

As illustrated in FIG. 7, the data processing system D includes a computer 200 having a master node processor 202 and memory 204 coupled to the processor 202 to store operating instructions, control information and database records therein. The data processing system D is preferably a multicore processor with nodes such as those from Intel Corporation or Advanced Micro Devices (AMD), or an HPC Linux cluster computer. The data processing system D may also be a mainframe computer of any conventional type of suitable processing capacity such as those available from International Business Machines (IBM) of Armonk, N.Y. or other source. The data processing system D may in cases also be a computer of any conventional type of suitable processing capacity, such as a personal computer, laptop computer, or any other suitable processing apparatus. It should thus be understood that a number of commercially available data processing systems and types of computers may be used for this purpose.

The computer 200 is accessible to operators or users through user interface 206 and are available for displaying output data or records of processing results obtained according to the present invention with an output graphic user display 208. The output display 208 includes components such as a printer and an output display screen capable of providing printed output information or visible displays in the form of graphs, data sheets, graphical images, data plots and the like as output records or images.

The user interface 206 of computer 200 also includes a suitable user input device or input/output control unit 210 to provide a user access to control or access information and database records and operate the computer 200. Data processing system D further includes a database of data stored in computer memory, which may be internal memory 204, or an external, networked, or non-networked memory as indicated at 216 in an associated database 218 in a server 220.

The data processing system D includes program code 222 stored in non-transitory memory 204 of the computer 200. The program code 222 according to the present invention is in the form of computer operable instructions causing the data processor 202 to form subsurface reservoir models with 3D natural fractures prediction according to the present invention in the manner that has been set forth.

It should be noted that program code 222 may be in the form of microcode, programs, routines, or symbolic computer operable languages that provide a specific set of ordered operations that control the functioning of the data processing system D and direct its operation. The instructions of program code 222 may be stored in memory 204 of the data processing system D, or on computer diskette, magnetic tape, conventional hard disk drive, electronic read-only memory, optical storage device, or other appropriate data storage device having a computer usable non-transitory medium stored thereon. Program code 222 may also be contained on a data storage device such as server 220 as a non-transitory computer readable medium, as shown.

The data processing system D may be comprised of a single CPU, or a computer cluster as shown in FIG. 4, including computer memory and other hardware that makes it possible to manipulate data and obtain output data from input data. A cluster is a collection of computers, referred to as nodes, connected via a network. Usually a cluster has one or two head nodes or master nodes 202 that are used to synchronize the activities of the other nodes, referred to as processing nodes 224. The processing nodes 224 each execute the same computer program and work independently on different segments of the grid which represents the reservoir.

Fracture characterization and prediction is a current challenge in areas where the reservoir formations and other formations are of high structural complexity. The methodology of the present invention improves reservoir hydrocarbon exploration, and in particularly the location and completion of wells for hydrocarbon production. Wells are drilled based on the fracture modeling of natural fracture characteristics of subsurface reservoir formations. The fracture models reflect the influence of several measures of formation parameters obtained from several disciplines. The predicted natural fractures are incorporated into a geological model of the region of interest, such as shown at S in FIG. 1. The present invention thus provides well placement based on natural fracture modeling, with dual porosity model estimations. The present reduces drilling risk and allows evaluation of the hydrocarbon storage capacities in the natural fractures of reservoir formations of interest.

The natural fractures are important resource for hydrocarbon storage and contributed the fluid flow capacity into the subsurface reservoir, improving the permeability and porous interconnection; in order to optimize the hydrocarbon extraction several technics have been incorporate into the new methodological approach to represent, in the more realistic way, the fractures distribution and properties.

The invention has been sufficiently described so that a person with average knowledge in the matter may reproduce and obtain the results mentioned in the invention herein Nonetheless, any skilled person in the field of technique, subject of the invention herein, may carry out modifications not described in the request herein, to apply these modifications to a determined structure, or in the manufacturing process of the same, requires the claimed matter in the following claims; such structures shall be covered within the scope of the invention.

It should be noted and understood that there can be improvements and modifications made of the present invention described in detail above without departing from the spirit or scope of the invention as set forth in the accompanying claims.

What is claimed is:

1. A method of drilling a well in a subsurface geological structure to a location in a subsurface hydrocarbon reservoir indicated by a natural fracture network model validated against production measures from the reservoir, comprising the steps of:
   (a) obtaining reservoir parameters (102) representing properties of the subsurface reservoir for processing in a data processing system, the reservoir parameters comprising:
      (1) rock mechanical properties (106) from geological models of the subsurface geological structure; and
      (2) reservoir engineering measures (112) obtained from production from the subsurface hydrocarbon reservoir, (b) forming a predicted natural fracture network model (132) by processing the obtained reservoir parameters in the data processing system to by performing computer implemented processing steps of:
  (1) forming a geomechanics forward model (144) to estimate in situ stress conditions in the reservoir;
  (2) forming a 3D geomechanics model (160) of rock mechanical properties distribution in the reservoir;
  (3) forming indications (162) of fractures in the reservoir based on the rock mechanical properties; and
  (4) identifying natural fracture locations (166) in the reservoir; and
(c) quantifying natural fractures density of the predicted natural fracture model of the reservoir to characterize the intensity (172) of fractures in the reservoir;
(d) validating the quantified natural fracture network model (174) with the reservoir engineering production measures from production in the reservoir; and
(e) drilling the well (122) in the subsurface geological structure to a location in the subsurface hydrocarbon reservoir based on the identified presence and extent of natural fractures in the validated natural fracture network model of the subsurface geological structure.

2. The method of claim 1, wherein the identified presence and extent of natural fractures in the subsurface geological structure indicate fractures conducive to increased production of hydrocarbons from the reservoir.

3. The method of claim 1, wherein the identified presence and extent of natural fractures in the subsurface geological structure indicate fractures adversely affecting drilling.

4. The method of claim 1, wherein the well comprises an exploration well.

5. The method of claim 1, wherein the well comprises a production well.

6. The method of claim 1, wherein: (a) the step of obtaining reservoir parameters further includes obtaining structural restoration models (108) of the subsurface geological structure; and (b) the step of forming a geomechanics forward model (144) to estimate in situ stress conditions is performed based on the obtained structural restoration models.

7. The method of claim 1, wherein the step of identifying natural fracture locations (166) in the reservoir is performed based on the obtained rock mechanical properties (106) of the subsurface geological structure.

8. The method of claim 1, wherein the step of forming a predicted natural fracture model quantifying fracture density (132) is performed based on: (a) a fracture indicator controller (166) identifying the nature of fracture locations in the subsurface reservoir; and (b) a one-dimensional natural fracture characterization (172).

9. The method of claim 8, wherein: (a) the step of obtaining reservoir parameters further includes obtaining seismic attributes (104a) from seismic surveys (104) of the subsurface geological structure; and (b) the step of identifying natural fracture density locations (166) is performed after performing seismic fracture detection (140) based on the obtained seismic attributes.

10. The method of claim 9, wherein the step of forming a geomechanics forward model (144) is performed based on a structural restoration model (108) of the subsurface reservoir.

11. The method of claim 9, wherein the step of performing seismic fracture detection (140) comprises performing azimuthal analysis to determine variations in seismic wave propagation in the subsurface reservoir.

12. The method of claim 8, wherein: (a) the step of obtaining reservoir parameters further includes obtaining core and well log data (110) from the reservoir and (b) the one-dimensional natural fracture characterization (172) is formed based on the obtained core and well log (110b) data from the subsurface reservoir.

13. The method of claim 8, wherein: (a) the step of obtaining reservoir parameters further includes obtaining seismic attributes (104a) from seismic surveys (104) of the subsurface geological structure; and (b) the step of identifying natural fracture locations (166) in the reservoir is performed based on the obtained seismic attributes.

14. The method of claim 13, wherein the step of identifying natural fracture locations (166) in the reservoir is further performed based on the obtained rock mechanical properties (106) of the subsurface geological structure.

* * * * *